(12) United States Patent
Bu et al.

(10) Patent No.: US 11,469,341 B2
(45) Date of Patent: Oct. 11, 2022

(54) OPTICAL DETECTION PANEL, FABRICATING METHOD THEREOF AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Qianqian Bu, Beijing (CN); Weipin Hu, Beijing (CN); Dan Wang, Beijing (CN); Yun Qiu, Beijing (CN); Xiao Sun, Beijing (CN); Congcong Wei, Beijing (CN)

(73) Assignees: BEIJING BOE DISPLAY TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 16/638,523

(22) PCT Filed: Oct. 8, 2019

(86) PCT No.: PCT/CN2019/109940
§ 371 (c)(1),
(2) Date: Feb. 12, 2020

(87) PCT Pub. No.: WO2020/155664
PCT Pub. Date: Aug. 6, 2020

(65) Prior Publication Data
US 2021/0234059 A1 Jul. 29, 2021

(30) Foreign Application Priority Data
Jan. 31, 2019 (CN) .......................... 201910098983.X

(51) Int. Cl.
*H01L 27/14* (2006.01)
*H01L 31/115* (2006.01)
(Continued)

(52) U.S. Cl.
CPC ........ *H01L 31/115* (2013.01); *H01L 27/1462* (2013.01); *H01L 27/14609* (2013.01);
(Continued)

(58) Field of Classification Search
CPC ......... H01L 27/14627; H01L 27/14609; H01L 27/14669; H01L 27/14676; H01L 27/14685
See application file for complete search history.

(56) References Cited

U.S. PATENT DOCUMENTS

2008/0048104 A1    2/2008   Oka et al.
2008/0231574 A1*   9/2008   Jessop .................. G02B 26/004
                                                          345/89

(Continued)

FOREIGN PATENT DOCUMENTS

CN    101405625 A    4/2009
CN    101726847 A    6/2010
(Continued)

OTHER PUBLICATIONS

International Search Report dated Jan. 7, 2020, issued in counterpart Application No. PCT/CN2019/109940 (5 pages).
(Continued)

*Primary Examiner* — Matthew L Reames
(74) *Attorney, Agent, or Firm* — WHDA, LLP

(57) ABSTRACT

The present disclosure relates to an optical detection panel. The optical detection panel may include a first substrate and a second substrate opposite the first substrate, a photosensitive component and a driving thin film transistor at a side of the second substrate facing the first substrate, a first electrode and a second electrode at a side of the second substrate facing the first substrate, and a plurality of microlenses at a side of the photosensitive component opposite from the second substrate. The second electrode may be connected to the driving thin film transistor.

11 Claims, 8 Drawing Sheets

(51) Int. Cl.
*H01L 27/146* (2006.01)
*H01L 31/0216* (2014.01)
*H01L 31/0232* (2014.01)
*H01L 31/18* (2006.01)

(52) U.S. Cl.
CPC .. *H01L 27/14627* (2013.01); *H01L 27/14669* (2013.01); *H01L 27/14676* (2013.01); *H01L 27/14685* (2013.01); *H01L 31/02161* (2013.01); *H01L 31/02327* (2013.01); *H01L 31/186* (2013.01)

(56) References Cited

U.S. PATENT DOCUMENTS

| | | | | |
|---|---|---|---|---|
| 2012/0267539 | A1* | 10/2012 | Shinba | H01L 31/02322 250/366 |
| 2014/0016176 | A1* | 1/2014 | Kodani | C08J 5/18 359/290 |
| 2015/0378032 | A1 | 12/2015 | Guo et al. | |
| 2017/0018588 | A1* | 1/2017 | Karim | A61B 6/4233 |
| 2018/0188390 | A1 | 7/2018 | Jiang | |
| 2019/0229150 | A1* | 7/2019 | Isono | H04N 5/376 |
| 2021/0139690 | A1* | 5/2021 | Oya | G03F 7/027 |

FOREIGN PATENT DOCUMENTS

| | | |
|---|---|---|
| CN | 102138102 A | 7/2011 |
| CN | 102253438 A | 11/2011 |
| CN | 102346308 A | 2/2012 |
| CN | 104641468 A | 5/2015 |
| CN | 205263446 U | 5/2016 |
| CN | 108962928 A | 12/2018 |
| CN | 109801935 A | 5/2019 |
| JP | 2006203011 A | 8/2006 |

OTHER PUBLICATIONS

Office Action dated Jun. 11, 2020, issued in counterpart CN Application No. 201910098983.X, with English translation (16 pages).

* cited by examiner

OPTICAL DETECTION PANEL, FABRICATING METHOD THEREOF AND DISPLAY APPARATUS

CROSS-REFERENCE TO RELATED APPLICATIONS

This application claims benefit of the filing date of Chinese Patent Application No. 201910098983.X filed on Jan. 31, 2019, the disclosure of which is hereby incorporated in its entirety by reference.

TECHNICAL FIELD

The present disclosure relates to display technologies, and in particular, to an optical detection panel, a fabricating method thereof and a display apparatus.

BACKGROUND

Microlenses are currently utilized in optical detection panels. They are fabricated on photosensitive components to optimize the detection. However, the precise positioning of the microlenses is still challenging due to the small size of the microlenses. The fabrication of the microlenses is prone to positional errors, which affect the detection performance of the optical detection panels.

BRIEF SUMMARY

One embodiment of the present disclosure is an optical detection panel. The optical detection panel may include a first substrate and a second substrate opposite the first substrate, a photosensitive component and a driving thin film transistor at a side of the second substrate facing the first substrate, a first electrode and a second electrode at a side of the second substrate facing the first substrate, and a plurality of microlenses at a side of the photosensitive component opposite from the second substrate. The second electrode may be connected to the driving thin film transistor.

Optionally, the optical detection panel may further include a readout thin film transistor at the side of the second substrate facing the first substrate. The photosensitive component may be configured to generate electrical signals when being exposed to the light. The readout thin film transistor may be configured to receive the electrical signals generated by the photosensitive component.

Optionally, the optical detection panel may further include a first hydrophobic layer at a side of the first electrode facing the second electrode, and a second hydrophobic layer at a side of the second electrode facing the first electrode. Each of the plurality of microlenses may be formed from a droplet, the droplet may be between the first hydrophobic layer and the second hydrophobic layer, and each of the plurality of microlenses may be configured to focus light onto the photosensitive component under control of an electric field between the first electrode and the second electrode.

Optionally, the optical detection panel may be a detection panel for detecting X-ray, and may further include a scintillator layer at a side of the microlenses opposite from the photosensitive component. The scintillator layer may be configured to convert the X-ray into visible light, and the photosensitive component may be a photodiode.

Optionally, the optical detection panel may be a detection panel for detecting infrared light, and may further include a first interdigital electrode and a second interdigital electrode opposite the first interdigital electrode between the readout thin film transistor and the photosensitive component. The first interdigital electrode may be connected to the readout thin film transistor.

Optionally, the photosensitive component may include an infrared sensitive layer at a side of the first interdigital electrode and the second interdigital electrode opposite from the second substrate. The infrared sensitive layer is configured to transduce the infrared light into the electrical signals.

Optionally, the optical detection panel may further include an organic insulating layer between the first interdigital electrode and the infrared sensitive layer and between the second interdigital electrode and the infrared sensitive layer.

Optionally, the optical detection panel may further include an insulating dielectric oil having a first refractive index and the droplet having a second refractive index between the first hydrophobic layer and the second hydrophobic layer. The second refractive index may be greater than the first refractive index, the insulating dielectric oil and the droplet form a curved interface, and a radius of a curvature of the curved interface may be adjustable under control of the electric field between the first electrode and the second electrode.

Optionally, the droplet may include an ionic liquid or a polymeric solution.

Optionally, a center of the photosensitive component may be on an axis of one of the microlenses.

One embodiment of the present disclosure is a display apparatus. The display apparatus may include the optical detection panel.

One embodiment of the present disclosure is a method for fabricating an optical detection panel. The method may include: providing a first substrate and a second substrate opposite the first substrate: forming a photosensitive component and a driving thin film transistor at a side of the second substrate facing the first substrate; forming a second electrode and a first electrode at the side of the second substrate facing the first substrate, wherein the second electrode is connected to the driving thin film transistor; forming a droplet between the first electrode and the second electrode; and driving the droplet to move onto the photosensitive component to form a microlens under control of an electric field between the first electrode and the second electrode through the driving thin film transistor. The microlens may be configured to focus light onto the photosensitive component.

Optionally, the method of fabricating the optical detection panel, before forming the second electrode and the first electrode, may further include forming a readout thin film transistor at the side of the second substrate facing the first substrate. The readout thin film transistor may be configured to receive electrical signals generated by the photosensitive component when being exposed to the light.

Optionally, the method of fabricating the optical detection panel may further include forming a first hydrophobic layer at a side of the first electrode facing the second electrode, forming a second hydrophobic layer at a side of the second electrode facing the first electrode, and forming the droplet between the first hydrophobic layer and the second hydrophobic layer.

Optionally, in the method of fabricating the optical detection panel, forming the droplet between the first hydrophobic layer and the second hydrophobic layer may include: aligning and assembling the first substrate and the second substrate; encapsulating the first substrate and the second substrate using a frame sealant, wherein a space remains between the first substrate and the second substrate, and a reserved channel connecting to the space is maintained in the frame sealant; and injecting the droplet through the reserved channel into the space between the first hydrophobic layer and the second hydrophobic layer.

Optionally, in the method of fabricating the optical detection panel, the droplet may be a polymeric droplet, and driving the droplet to move onto the photosensitive component to form the microlens may include: driving the polymeric droplet to move onto the photosensitive component, and performing a solidifying process to the polymeric droplet to form the microlens. A center of the photosensitive component is on an axis of the microlens.

Optionally, in the method of fabricating the optical detection panel, the optical detection panel may be a detection panel for detecting X-ray. The method may further include: forming a scintillator layer at a side of the microlens opposite from the photosensitive component. The scintillator layer is configured to convert the X-ray into visible light, and the photosensitive component may be a photodiode.

Optionally, in the method of fabricating the optical detection panel, the optical detection panel may be a detection panel for detecting infrared light. The method may further include forming a first interdigital electrode and a second interdigital electrode between the readout thin film transistor and the photosensitive component by one patterning process, wherein the first interdigital electrode is connected to the readout thin film transistor.

Optionally, in the method of fabricating the optical detection panel, forming the photosensitive component may include forming an infrared sensitive layer at a side of the first interdigital electrode and the second interdigital electrode opposite from the second substrate.

Optionally, in the method of fabricating the optical detection panel, the droplet may include an insulating dielectric oil having a first refractive index and a transparent droplet having a second refractive index, the second refractive index may be greater than the first refractive index, the insulating dielectric oil and the transparent droplet may form a curved interface. Driving the droplet to move onto the photosensitive component to form the microlens may include: driving the insulating dielectric oil and the transparent droplet to move onto the photosensitive component to form the microlens; and controlling the electric field between the first electrode and the second electrode to change a radius of curvature of the curved interface so as to change a focal length of the microlens.

BRIEF DESCRIPTION OF THE DRAWINGS

The drawings are intended to provide a further understanding of the technical solutions of the present disclosure, and are intended to be part of the specification, and are used to explain the technical solutions of the present disclosure, and do not constitute a limitation of the technical solutions of the present disclosure.

DETAILED DESCRIPTION

Figure 1:
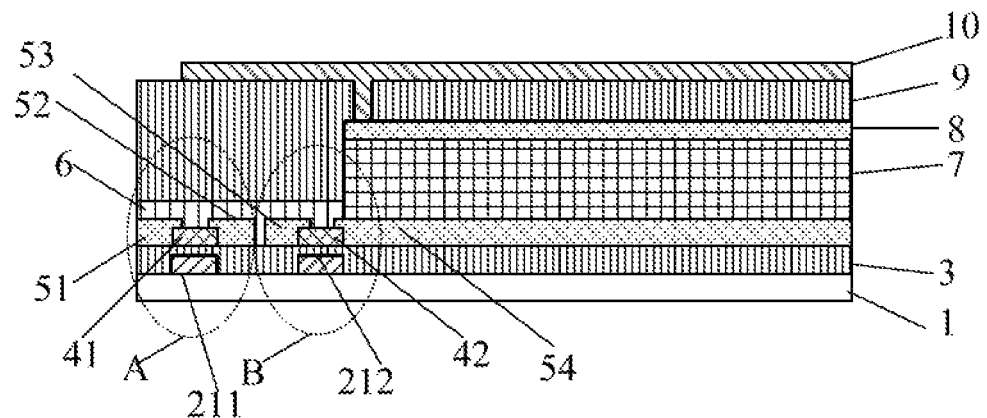
FIG. 1 is a schematic diagram showing a microlens driving circuit of an X-ray detection panel according to one embodiment of the present disclosure.

The technical problems, the technical solutions, and the advantages of the embodiments of the present disclosure will be more clearly described in the following description.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly.

It should be understood that when an element such as a layer, a film, a region or a substrate is referred to as being "on" or "under," there may be intermediate elements.

In the prior art, the process precision is limited, so that the positioning of the microlens is prone to deviation, thereby affecting the detection performance of the optical detection panel. Accordingly, some embodiments of the present disclosure provide an optical detection panel, a fabricating method thereof, and a display apparatus capable of optimizing the detection effect of the optical detection panel.

One embodiment of the present disclosure provides an optical detection panel, comprising:

a first substrate and a second substrate disposed opposite to each other;

a photosensitive component, a readout thin film transistor and a driving thin film transistor at a side of the second substrate facing the first substrate, wherein the readout thin film transistor is used to receive electrical signals generated by the photosensitive component after receiving optical signals;

a second electrode and a first electrode at a side of the second substrate facing the first substrate, wherein the second electrode is connected to the driving thin film transistor; and a microlens at a side of the photosensitive component opposite from the second substrate, wherein the microlens is formed from a droplet, and configured to focus external light onto the photosensitive component under control of an electric field between the first electrode and the second electrode.

In one embodiment, the driving thin film transistor controls the electric field between the first electrode and the second electrode. The electric field drives a droplet to move onto the photosensitive component to form a microlens. The position of the microlens can be precisely controlled so that the position of the photosensitive component can be precisely matched with the position of the microlens, thereby optimizing the detection of the optical detection panel.

The first electrode and the second electrode may be located on the same substrate or on different substrates.

In one embodiment, the first electrode and the second electrode are on different substrates. The first electrode is located at a side of the second substrate facing the first substrate, and the second electrode is located at a side of the first substrate facing the second substrate.

In one embodiment, the optical detection panel can be utilized for detecting X-rays or infrared light. In one embodiment, the optical detection panel is used to detect X-rays, and the photosensitive component may be a photodiode. In one embodiment, the optical detection panel is used to detect infrared light, and the photosensitive component may be an infrared photosensitive layer.

In one embodiment, for X-ray detection, the optical detection panel further includes a scintillator layer at a side of the microlens opposite from the photosensitive component. The scintillator layer can convert the X-ray into visible light. After detecting the visible light, the photosensitive component can transduce the visible light into an electrical signal, thereby achieving X-ray detection in the optical detection panel.

In one embodiment, the X-ray detection panel further includes:

a first hydrophobic layer at a side of the first electrode facing the second electrode;

a second hydrophobic layer at a side of the second electrode facing the first electrode, wherein the droplet is disposed between the first hydrophobic layer and the second hydrophobic layer. The hydrophobic layer is repulsive to the droplet, and accordingly the droplet is unable to spread on the surface of the hydrophobic layer and maintain a spherical shape, so that disposing the droplet between the first hydrophobic layer and the second hydrophobic layer may help the droplet to move.

In one embodiment, the X-ray detection panel includes:

a second substrate;

a photosensitive component, a readout thin film transistor and a driving thin film transistor on the second substrate, wherein the readout thin film transistor is connected to the photosensitive component;

a second electrode, which is connected to the driving thin film transistor, on the second substrate;

a second hydrophobic layer on the second electrode;

a first substrate opposite the second substrate;

a first electrode at a side of the first substrate facing the second substrate;

a scintillator layer at a side of the first substrate opposite from the second substrate;

a first hydrophobic layer at a side of the first electrode opposite from the first substrate;

microlenses located between the first hydrophobic layer and the second hydrophobic layer, therein the microlenses have a one to one correspondence with the photosensitive components.

In one embodiment, the optical detection panel is an infrared light detection panel, and the optical detection panel further includes:

a first interdigital electrode and a second interdigital electrode opposite the first interdigital electrode disposed between the readout thin film transistor and the photosensitive component, wherein the first interdigital electrode is connected to the readout thin film transistor.

The infrared sensitive layer as the photosensitive component is located at a side of the first interdigital electrode and the second interdigital electrode opposite from the second substrate, and the infrared sensitive layer can transduce the infrared light into an electrical signal to achieve infrared detection.

In one embodiment, the infrared light detection panel further includes:

a first hydrophobic layer at a side of the first electrode facing the second electrode;

a second hydrophobic layer at a side of the second electrode facing the first electrode, wherein a droplet is disposed between the first hydrophobic layer and the second hydrophobic layer. The hydrophobic layer is repulsive to the droplet, and accordingly the droplet is unable to spread on the surface of the hydrophobic layer and maintains a spherical shape, so that disposing the droplet between the first hydrophobic layer and the second hydrophobic layer may help the droplet to move.

In one embodiment, the infrared light detection panel further includes:

an organic insulating layer between the first/second interdigital electrodes and the infrared sensitive layer. In order to prevent excess current generated by the infrared sensitive layer affecting the performance of the optical detection panel, an organic insulating layer is formed between the first interdigital electrodes and the infrared sensitive layer and between the second interdigital electrodes and the infrared sensitive layer, which can reduce the electrical signal received by the first interdigital electrode.

In one embodiment, the infrared light detection panel includes:

a second substrate;

a readout thin film transistor and a driving thin film transistor on the second substrate;

a first passivation layer;

a first interdigital electrode and a second interdigital electrode opposite the first interdigital electrode in the same layer on the first passivation layer, wherein the first interdigital electrode is connected to the readout thin film transistor;

an organic insulating layer covering the first interdigital electrode and the second interdigital electrode;

an infrared sensitive layer on the organic insulating layer, wherein the readout thin film transistor is configured to receive an electrical signal generated by the infrared sensitive layer after detecting optical signals;

a second passivation layer covering the infrared sensitive layer;

a second electrode on the second passivation layer;

a second hydrophobic layer on the second electrode;

a first substrate opposite the second substrate;

a first electrode at a side of the first substrate facing the second substrate;

a first hydrophobic layer at a side of the first electrode opposite from the first substrate;

an insulating dielectric oil having a first refractive index and a transparent droplet having a second refractive index which are disposed between the first hydrophobic layer and the second hydrophobic layer, wherein the second refractive index is larger than the first refractive index, the insulating dielectric oil and the droplet come into contact and form a curved interface, the droplet forms a microlens, and the curvature of the interface is adjustable by means of an electric field between the first electrode and the second electrode.

Furthermore, the droplets may be made of ionic liquids.

Another embodiment of the present disclosure provides a method for fabricating an optical detection panel, including:

providing a first substrate and a second substrate opposite the first substrate;

fabricating a photosensitive component, a readout thin film transistor and a driving thin film transistor at a surface of the second substrate facing the first substrate, wherein the readout thin film transistor is configured to receive an electrical signal generated by the photosensitive component after detecting an optical signal;

forming a second electrode and a first electrode at a side of the second substrate facing the first substrate, wherein the second electrode is connected to the driving thin film transistor;

forming a droplet, wherein the droplet can be moved by means of an electric field between the first electrode and the second electrode;

The electric field between the first electrode and the second electrode can be controlled by the driving thin film transistor. The droplet can be driven by the electric field to move onto the photosensitive component to form a microlens that focuses external light onto the photosensitive component.

In one embodiment, the driving thin film transistor controls the electric field between the first electrode and the second electrode. The electric field drives a droplet to move onto the photosensitive component to form a microlens. The position of the microlens can be precisely controlled so that the positions of the photosensitive component and the microlens can be precisely matched, thereby optimizing the detection of the light detection panel.

The first electrode and the second electrode may be located on the same substrate, such as on the second substrate, or on different substrates.

In one embodiment, the first electrode and the second electrode are on different substrates. The first electrode is located at a side of the second substrate facing the first substrate, and the second electrode is located at a side of the first substrate facing the second substrate.

In one embodiment, the optical detection panel can be utilized for detecting X-rays or infrared light. The photosensitive component may be a photodiode for detecting X-rays, or the photosensitive component may be an infrared photosensitive layer for detecting infrared light.

In one embodiment, the optical detection panel is an X-ray detection panel, the fabricating method of the optical detection panel for X-ray detection includes:

providing a second substrate;

forming a photosensitive component, a readout thin film transistor, and a driving thin film transistor on the second substrate, wherein the readout thin film transistor is configured to receive an electrical signal generated by the photosensitive component after detecting an optical signal;

Optionally, forming a passivation layer covering the photosensitive component, the readout thin film transistor, and the driving thin film transistor;

forming a second electrode on the passivation layer, wherein, the second electrode is connected to the driving thin film transistor;

Optionally, forming a second hydrophobic layer on the second electrode, wherein a second Teflon layer may be formed by spin coating or dip coating, and the second Teflon layer may be annealed to form the second hydrophobic layer;

providing a first substrate;

forming a first electrode on the first substrate;

forming a scintillator layer at a side of the first substrate opposite from the first electrode, wherein the scintillator layer is capable of converting X-rays into visible light so that the optical detection panel can achieve X-ray detection;

Optionally, forming a first hydrophobic layer on the first electrode, wherein a first Teflon layer may be formed by spin coating or dip coating, and the first Teflon layer may be annealed to form the first hydrophobic layer;

Aligning and assembling the first substrate and the second substrate, wherein the first electrode and the second electrode are located between the first substrate and the second substrate, and the first substrate and the second substrate are encapsulated by using a frame sealant, the frame sealant does not completely seal an inner space between the first substrate and the second substrate, and a reserved channel is maintained for injecting droplets;

injecting a droplet between the first hydrophobic layer and the second hydrophobic layer through the reserved channel between the first hydrophobic layer and the second hydrophobic layer, driving the droplet by means of an electric field between the first electrode and the second electrode to move onto the photosensitive component, and solidifying the droplet to form microlens, wherein the droplet may be a polymeric droplet and the center of the photosensitive component may be located on the axis of the microlens.

In one embodiment, the optical detection panel is an infrared detection panel, and the method for fabricating the optical detection panel for infrared detection includes:

providing a second substrate;

forming a readout thin film transistor and a driving thin film transistor on the second substrate, wherein the readout thin film transistor is configured to receive an electrical signal generated by the photosensitive component after detecting the optical signal;

Optionally, forming a first passivation layer covering the readout thin film transistor and the driving thin film transistor;

forming a first interdigital electrode and a second interdigital electrode opposite the first interdigital electrode in the same layer on the first passivation layer, wherein the first interdigital electrode is connected to the readout thin film transistor;

Optionally, forming an organic insulating layer covering the first interdigital electrode and the second interdigital electrode;

an infrared sensitive layer on the organic insulating layer, wherein the readout thin film transistor is configured to receive an electrical signal generated by the infrared sensitive layer after detecting optical signals;

Optionally, forming a second passivation layer covering the infrared sensitive layer;

forming a second electrode on the second passivation layer, wherein the second electrode is connected to the driving thin film transistor;

Optionally, forming a second hydrophobic layer on the second electrode, wherein a second Teflon layer may be formed by spin coating or dip coating, and the second Teflon layer may be annealed to form the second hydrophobic layer;

providing a first substrate;

forming a first electrode on the first substrate;

Optionally, forming a first hydrophobic layer on the first electrode, wherein the first Teflon layer may be formed by spin coating or dip coating, and the first Teflon layer may be annealed to form the first hydrophobic layer;

aligning and assembling the first substrate and the second substrate, wherein the first electrode and the second electrode are located between the first substrate and the second substrate, and the first substrate and the second substrate are encapsulated using the frame sealant, the frame sealant does not completely seal the inner space between the first substrate and the second substrate, and a reserved channel is maintained for injecting droplets;

injecting liquids between the first hydrophobic layer and the second hydrophobic layer through the reserved channel between the first hydrophobic layer and the second hydrophobic layer, wherein the liquids include an insulating dielectric oil with a first refractive index and a transparent droplet with a second refractive index, the second refractive index is greater than the first refractive index, and the insulating dielectric oil and the transparent droplet come into contact and form a curved interface, and driving and moving the insulating dielectric oil and the transparent droplet by means of an electric field between the first electrode and the second electrode onto the photosensitive component. The droplet forms a microlens, the electric field between the first electrode and the second electrode may be controlled to adjust the curvature of the interface for changing the focal length of the microlens. Optionally, the droplets may be formed of ionic liquids.

The optical detection panel of the present disclosure and a fabricating method thereof are further described below with reference to the accompanying drawings and specific embodiments:

In one embodiment, the optical detection panel is an X-ray detection panel.

X-ray is an ultrashort electromagnetic wave with a wavelength between about 10-0.01 nm, corresponding to frequencies in the range of $3 \times 10^{16}$ Hz to $3 \times 10^{19}$ Hz and energies in the range of 120 eV to 120 KeV. X-ray is composed of neutral high-energy photons that have a strong penetration effect on the object being irradiated. When the X-ray passes through the object, absorption and scattering by the object can change the intensity or phase of the X-ray. The changes depend on the type of material, structure, thickness, and defects of the object. Therefore, the internal structure of the object can be detected by X-rays. X-ray has been widely used in many fields such as medical imaging and detection, industrial safety detection, astronomical detection, high-energy ion detection, and environmental safely detection.

Digital X-ray detection is usually related to electronic imaging technology—flat panel detector technology. The electronic imaging board usually includes a large number of tiny detectors having thin film transistors (TFTs) arranged in an arrays. In one embodiment, the X-ray detection panel includes a scintillator layer (currently mainly using CsI), an amorphous silicon photodiode array, and a thin film transistor array.

The scintillator layer exposed to X-ray can convert the X-ray into visible light, and the amorphous silicon photodiode can transduce visible light into an electrical signal. The electrical signal of each pixel is transmitted to an image processing system of a computing device through the thin film transistor array. The image processing system integrates the electrical signals to generate a digital image. In order to achieve optimal detection, a common method includes fabricating a microlens on a photodiode. Currently, the method involves dry etching a polymer film to obtain the desired microlens pattern. However, because the X-ray detection panel employs array arrangement and the size of a single pixel is very small, the microlenses are prone to positional errors due to the limitation of the process precision, thereby affecting the detection of the X-ray detection panel. The positional errors sometimes make the detection even worse than without microlens.

In one embodiment, the method for fabricating the X-ray detection panel includes the following steps:

Step 1 includes, as shown in FIG. 1, providing a substrate, and fabricating a driving thin film transistor A, a readout thin film transistor B and a photodiode on the substrate 1.

In the step 1 the readout thin film transistor A is connected to the photodiode and is used to read electrical signals generated by the photodiode, and transmit the electrical signals to an image processing system. The image processing system may be located in an external computing device, such as a computer. An image can be created based on the electrical signals generated by the photodiode. The driving thin film transistor B is used to control droplet movement in a subsequent process to fabricate a microlens.

In one embodiment, step 1 includes the following:

forming a gate 211 of the driving thin film transistor A and a gate 212 of the readout thin film transistor B on the lower substrate 1. The gate 211 of the driving thin film transistor A and the gate 212 of the readout thin film transistor can be fabricated at the same time using the same material by one patterning process, which can reduce the number of patterning processes in the fabrication of the optical detection panel.

forming a gate insulating layer 3;

forming an active layer 41 of the driving thin film transistor. A and an active layer 42 of the readout thin film transistor B, optionally, wherein the active layer 41 and the active layer 42 can be fabricated at the same time using the same material by one patterning process to reduce the number of patterning processes in the fabrication of the optical detection panel;

forming a drain 51 and a source 52 of the driving thin film transistor A, a source 53 and a drain 54 of the readout thin film transistor B, optionally, wherein the source 52 and the drain 51 of the driving thin film transistor A, the source 53 and the drain 54 of the readout thin film transistor B can be fabricated at the same time using the same material by one patterning process, thereby reducing the number of patterning processes in the fabrication of the optical detection panel, and the drain 54 of the readout thin film transistor B may serve as an lower electrode of the photodiode;

forming a passivation layer 6 covering the driving thin film transistor A and the reading thin film transistor B;

forming a photosensitive layer 7 of the photodiode on the passivation layer 6, wherein the photosensitive layer 7 may be made of a-Si, and the photosensitive layer can generate an electrical signal after being exposed to light;

forming an upper electrode 8 of the photodiode on the photosensitive layer 7, wherein the lower electrode of the photodiode, the photosensitive layer 7 and the upper electrode 8 form a photodiode, that is, the above-mentioned photosensitive component, which is capable of generating an electrical signal after being exposed to light, and transmitting the electrical signal to the readout thin film transistor B for the electrical signal readout;

forming a first planarization layer 9, wherein the first planarization layer 9 may cover the photodiode the driving thin film transistor A and the readout thin film transistor B;

forming a bias electrode layer 10 on the first planarization layer 9, wherein the bias electrode provides electrical signals to the upper electrode 8 of the photodiode, and is connected to the upper electrode 8 of the photodiode through a via hole in the first planarization layer 9. In one embodiment, in order not to affect light detection of the photodiode, the bias electrode layer 10 is made of a transparent conductive material such as indium titian oxide (ITO).

Figure 2:
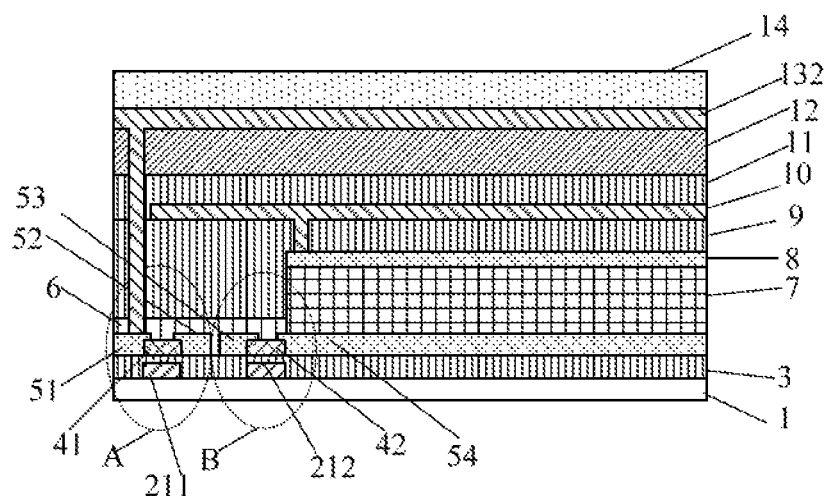
FIG. 2 is a schematic diagram showing a microlens driving circuit of an X-ray detection panel according to one embodiment of the present disclosure.

Step 2 includes, as shown in FIG. 2, sequentially forming a second planarization layer 11, a dielectric layer 12, a driving electrode layer 132 and a hydrophobic layer 14 on the lower substrate 1 following the step 1.

In order not to affect light detection of the photodiode, the driving electrode layer 132 is made of a transparent conductive material such as ITO, and the driving electrode layer 132 is connected to the drain 51 of the driving thin film transistor A. Optionally, the driving electrode layer 132 are connected to the drain 51 of the driving thin film transistor A through a via hole that penetrates through the passivation layer 6, the first planarization layer 9, the second planarization layer 11, and the dielectric layer 12.

Figure 3:
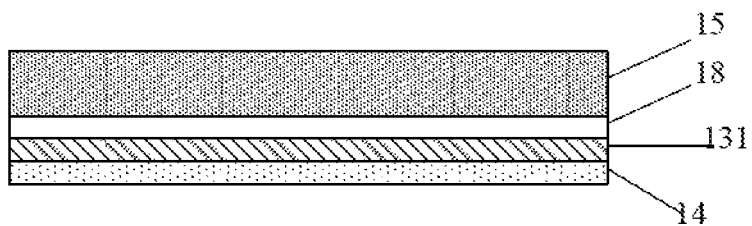
FIG. 3 is a schematic diagram showing an upper substrate of an X-ray detection panel according to one embodiment of the present disclosure.

Step 3 includes, as shown in FIG. 3, providing an upper substrate 18, and forming a scintillator layer 15, a driving electrode layer 131 and a hydrophobic layer 14 on the upper substrate 18.

Optionally, the scintillator layer 15 is formed at a side of the upper substrate 18 opposite from the lower substrate 1, and the driving electrode layer 131 and the hydrophobic layer 14 are formed at a side of the upper substrate 18 facing the lower substrate 1. The hydrophobic layer 14 is located at a side of the driving electrode layer 131 facing the lower substrate 1.

The upper substrate 18 may be an ultra-thin layer of glass or a transparent polymer film.

In order not to affect light detection of the photodiode, the driving electrode layer 131 may be made of a transparent conductive material such as ITO.

The scintillator layer 15 may be a gadolinium oxysulfide or cesium iodide (CsI) film layer, and it may be produced by vapor deposition or adhesion.

Figure 4:
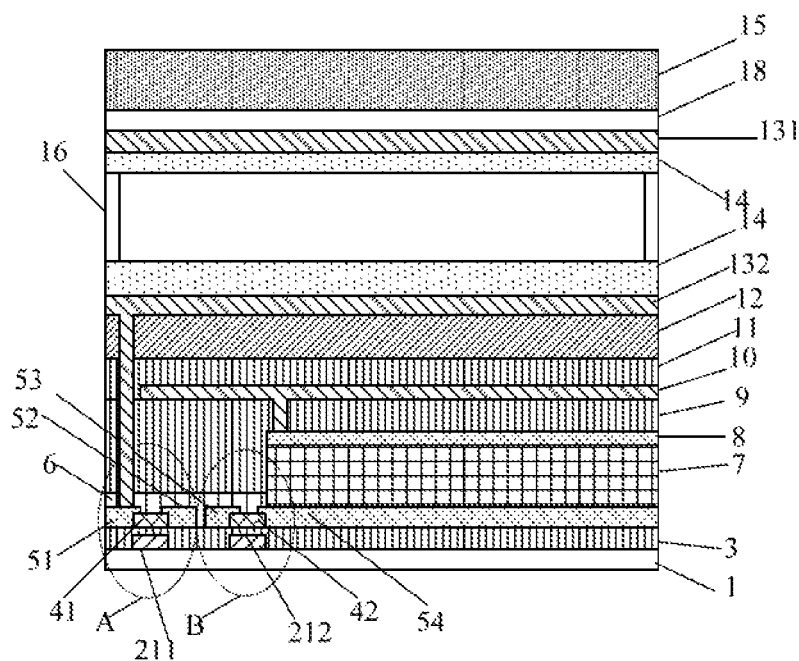
FIG. 4 is a schematic diagram showing an upper substrate and a lower substrate which are aligned and bonded together in an X-ray detection panel according to one embodiment of the present disclosure.
Figure 5:
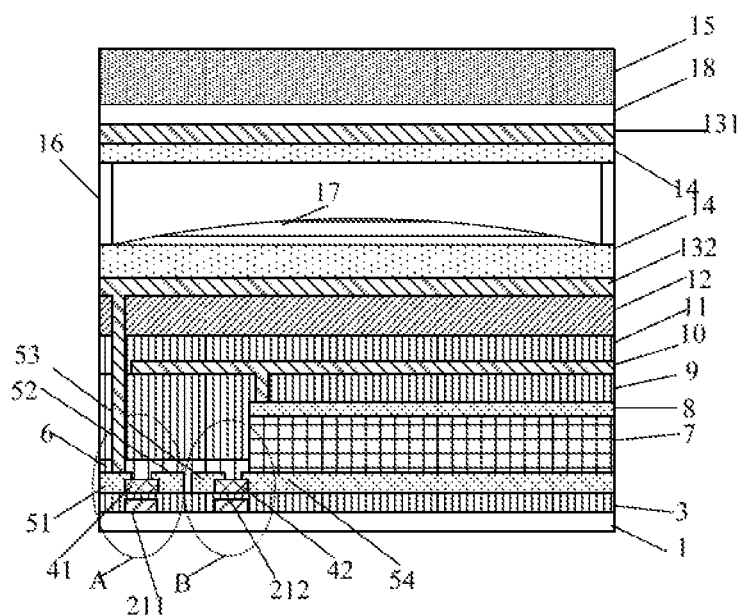
FIG. 5 is a schematic diagram showing an injected droplet between the upper and lower substrates in an X-ray detection panel according to one embodiment of the present disclosure.

Step 4 includes, as shown in FIG. 4 aligning and assembling the upper substrate 18 and the lower substrate 1, and encapsulating the upper, substrate 18 and the lower substrate 1 using a frame sealant 16, wherein the frame sealant does not completely seal the inner space between the upper substrate 18 and the lower substrate 1 and leaves a reserved channel for injecting droplets;

Step 5 includes, as shown in FIG. 5, injecting a droplet 17 between the upper substrate 18 and the lower substrate 1 through the reserved channel between the upper substrate 18 and the lower substrate 1, moving the droplet 17 to a predetermined location by applying an electrical signal to the driving electrode layer 132 through the driving thin film transistor A and generating an electric field between the driving electrode layers 131 and 132 on the upper and lower substrates, and solidifying the droplet 17 to form a microlens after it moves to the predetermined position.

The driving electrode layer 131 on the upper substrate is the first electrode, and the driving electrode layer 132 on the lower substrate is the second electrode.

The above steps can obtain the X-ray detection panel according to one embodiment of the present disclosure. As shown in FIG. 5, the X-ray detection panel includes: a lower substrate 1; a driving thin film transistor A; a readout thin film transistor B; a photodiode on the lower substrate 1, wherein the lower electrode of the photodiode can be commonly used as the drain 54 of the readout thin film transistor B, the photodiode including a lower electrode, a photosensitive layer 7 and an upper electrode 8; a first planarization layer 9 covering the photodiode, the driving thin film transistor A and the readout thin film transistor B; a bias electrode layer 10 on the first planarization layer 9, wherein the bias electrode layer is connected to the upper electrode 8 of the photodiode through a via hole penetrating the first planarization layer 9; a second planarization layer 11 on the bias electrode layer 10; a dielectric layer 12 on the second planarization layer 11; a driving electrode layer 132 on the dielectric layer 12; a hydrophobic layer 14 on the driving electrode layer 132; an upper substrate 18 aligned and assembled with the lower substrate 1; a scintillator layer 15 at a side of the upper substrate 18 opposite from the lower substrate 1; a driving electrode layer 131 at a side of the upper substrate 18 facing the lower substrate 1, a hydrophobic layer 14 on the driving electrode layer 131; and a droplet 17 disposed between the hydrophobic layers 14, wherein the droplet 17 forms a microlens.

In some embodiments of the present disclosure, a microfluidic system is introduced in the X-ray detection panel. A mixture of some polarized molecules and a transparent polymer can be injected through a reserved channel between the upper and lower substrates. By applying an external driving signal, a droplet with the appropriate size and radius of curvature is transported along the designed path onto the photodiode with high precision. Then, a solidifying process can be performed on the polymer droplet to form the desired microlens. The X-ray detection panel according to one embodiment of the present disclosure can greatly improve the light detecting efficiency because of the precise positioning of the microlens. Therefore, the light detection efficiency can be significantly improved, thereby reducing the X-ray radiation dose and improving the contrast and quality of the detection images. Furthermore, the driving thin film transistor and the readout thin film transistor can be fabricated using the same patterning process, which does not increase the fabrication cost of the optical detection panel.

In one embodiment, the optical detection panel is an infrared detection panel.

The infrared detection panel can capture images even in low light condition by imaging temperatures of the observation target, which plays an important role in security and surveillance. The infrared detection panel detects infrared light that is an electromagnetic wave with a longer wavelength than visible light. According to the wavelength, infrared light can be categorized into near-infrared (wavelengths ranging from 400 nm to 3 µm), mid-infrared (wavelengths ranging from 3 µm to 8 µm), and far infrared (wavelengths ranging from 8 µm to 14 µm).

The light detection efficiency is a critical factor determining the performance of the infrared detection panel. In order to achieve optimal detection, a microlens can be fabricated using a high refractive index material on the photosensitive component to collect and focus more light on the photosensitive component. However, because the photosensitive components of the infrared detection panel are arranged in an array and the size of a single photosensitive component is very small, positioning microlenses are prone to the positional errors due to limitation of the process precision, thereby affecting the detection of the infrared detection panel. The positional errors sometimes make the detection even worse than without the microlens.

In addition, for infrared light in different ranges of wavelengths, the optimal size and shape of the desired microlens vary. Therefore, in order to achieve better light detection, it is necessary to control the size and shape of the microlens.

Figure 6:
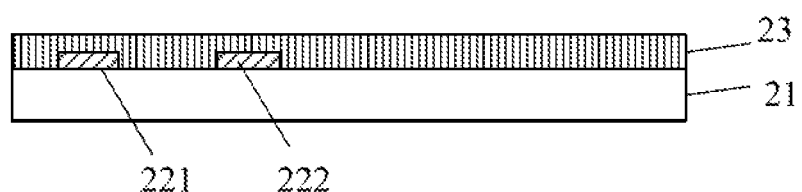
FIG. 6 is a schematic diagram showing a gate and a gate insulating layer in an infrared detection panel according to one embodiment of the present disclosure.

In one embodiment, the method of fabricating, an infrared optical detection panel includes:

Step 1 includes, as shown in FIG. 6, providing a lower substrate 21, forming a gate 221 of the driving thin film transistor A and a gate 222 of the readout thin film transistor B on the lower substrate 21, and forming a gate insulating layer 23.

In this step, the readout thin film transistor A is used for reading an electrical signal generated by the infrared photosensitive component, and transmitting the electrical signal to an image processing system. The image processing system may be located in an external computing device, such as a computer, capable of generating images based on the electrical signals of the photodiode. The driving thin film transistor B is used to drive a droplet in a subsequent process to control formation of microlenses having different sizes and curvatures.

The lower substrate 21 may be a glass substrate.

Optionally, the gate 221 of the driving thin film transistor A and the gate 222 of the thin film transistor B are formed first on the lower substrate 1. In one embodiment, the gate 221 and the gate 222 may be fabricated at the same time by one patterning process, which reduces the number of patterning processes in the fabrication. The materials of the gate electrodes 221 and 222 may be Mo/Al, and the thickness thereof may be in a range from about 2000 Å to 5000 Å, and the deviation of the film uniformity may be less than 10%.

The gate insulating layer 23 covering the gate electrode 221 and the gate electrode 222 may be a SiN/SiO thin film. The thickness of the gate insulating layer may be set to be less than about 5000 nm, and the deviation of the film uniformity may be less than 5%.

Figure 7:
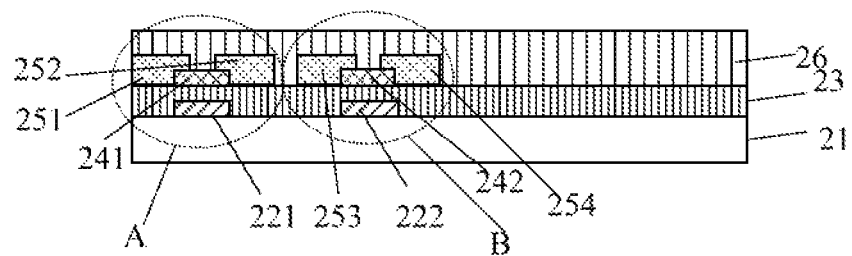
FIG. 7 is a schematic diagram showing a source, a drain, and a first passivation layer in an infrared detection panel according to one embodiment of the present disclosure.

Step 2 includes, as shown in FIG. 7, forming the active layer 241 of the driving thin film transistor A and the active layer 242 of the readout thin film transistor, the source 252 and the drain 251 of the driving thin film transistor A, the source 253 and the drain 254 of the readout thin film transistor, and the first passivation layer 26.

Optionally, the active layer 241 of the driving thin film transistor A and the active layer 242 of the readout thin film transistor B can be fabricated at the same time on the gate insulating layer 23 by one patterning process, which can reduce the number of the patterning processes for fabricating the optical detection panel. The material of the active layers 241 and 242 may be amorphous silicon, low temperature polysilicon or metal oxide material.

Optionally, the source 252 and the drain 251 of the driving thin film transistor A and the source 253 and the drain 254 of the readout thin film transistor B may be fabricated at the same time by one patterning process, which reduces the number of the patterning processes. The material of the source and the drain may be Mo/Al, the thickness thereof may be about 2000 Å to about 5000 Å, and the deviation of the film uniformity may be less than about 10%.

The first passivation layer 26 covers the driving thin film transistor A and the readout thin film transistor B. The first passivation layer 26 may be a SiN thin film. The thickness thereof may be set to be less than about 3000 nm. The deviation of the film uniformity may be less than about 5%.

Figure 8:
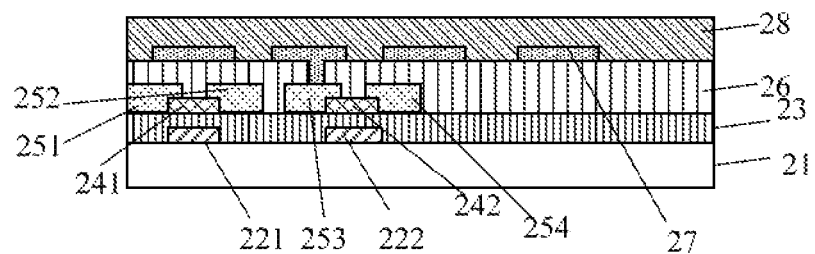
FIG. 8 is a schematic diagram showing an interdigital electrode and an organic insulating layer in an infrared detection panel according to one embodiment of the present disclosure.

Step 3 includes, as shown in FIG. 8, forming an interdigital electrode 27 on the first passivation layer 26 and forming an organic insulating layer 28 covering the interdigital electrode 27.

Figure 9:
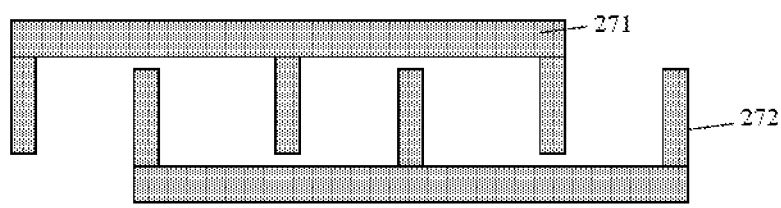
FIG. 9 is a schematic diagram showing an interdigital electrode according to one embodiment of the present disclosure.

In one embodiment, as shown in FIG. 9, the interdigital electrode 27 includes a first interdigital electrode 271 and a second interdigital electrode 272 opposite the first interdigital electrode 271. The interdigital electrode 27 may be made of Mo having a thickness in a range of about 2000 Å to about 2500 Å.

Figure 10:
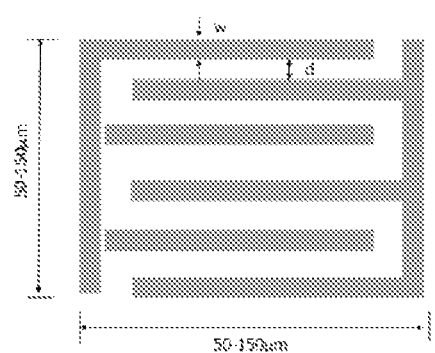
FIG. 10 is a schematic diagram showing the width and spacing of the interdigital electrodes according to one embodiment of the present disclosure.

In one embodiment, as shown in FIG. 10, the interdigital electrode 27 has three structural parameters, including the interdigital finger width w, the gap distance d between adjacent interdigitated fingers, and the thickness of the interdigital electrode. The larger the length to width ratio of the interdigital finger is and the larger the density of the interdigital fingers, the smaller the initial resistance of the interdigital electrode becomes, thereby increasing the sensitivity and response speed. The electric field strength of the interdigital electrodes is approximately inversely proportional to the electrode thickness. The thicker the electrode, the smaller the electric field strength. Therefore, the sensing performance of the interdigital electrode may be improved by optimizing, the related structural parameters of the interdigital electrodes. In one embodiment, the dimension of the photosensitive component may be about 50×50 µm², 100× µm² or 150×150 µm², the electrode spacing, d may be in a range of about 3 µm to about 10 µm, and the electrode width w may be in a range of about 5 µm to about 20 µm.

The organic insulating layer 28 has a high resistivity, and it may be made of polyimide. Charge transition occurs when the infrared sensitive layer 29 is exposed to infrared light. If the interdigital electrode 27 is directly in contact with the infrared sensitive layer 29, it is prone to breakdown and produces large noise. The organic insulating layer 28 between the interdigital electrode 27 and the infrared sensitive layer 29 can reduce the noise and avoid the breakdown.

Figure 11:
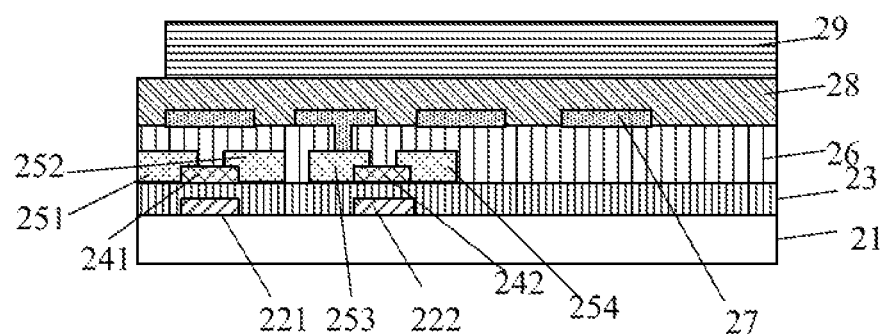
FIG. 11 is a schematic diagram showing an infrared photosensitive layer of an infrared detection panel according to one embodiment of the present disclosure.

Step 4 includes, as shown in FIG. 11, forming an infrared sensitive layer 29 on the organic insulating layer 28.

The infrared sensitive layer 29, that is, the above-mentioned photosensitive component, can generate an electrical signal after being exposed to infrared light, and transmit the electrical signal to the interdigital electrode 27 and then to the readout thin film transistor B for electrical signal readout. The infrared sensitive layer 29 may be made of vanadium oxide, amorphous silicon, or carbon nanotube. Optionally, the infrared sensitive layer may be made of amorphous silicon, the thickness of the infrared sensitive layer 29 may be in a range of about 4000 Å to about 5000 Å, and the deviation of the film uniformity may be less than about 5%.

Figure 12:
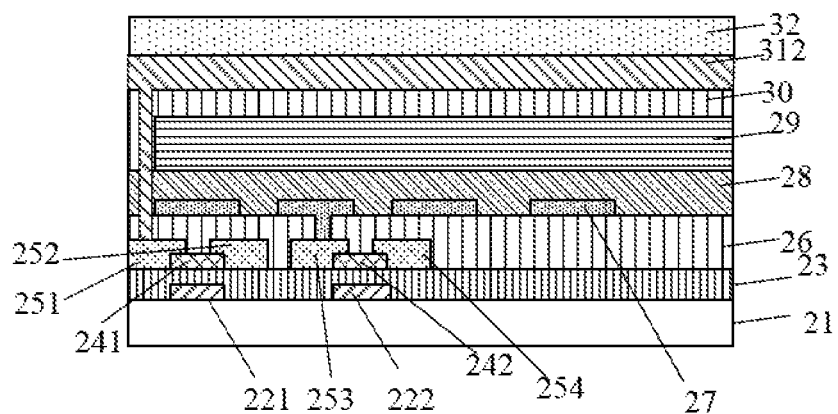
FIG. 12 is a schematic diagram showing a driving electrode layer and a hydrophobic layer of an infrared detection panel according to one embodiment of the present disclosure.

Step 5 includes, forming a second passivation layer 30, a driving electrode layer 312 and a hydrophobic layer 32, as shown in FIG. 12.

The second passivation layer 30 covers the infrared sensitive layer 29, the driving electrode layer 312 is located on the second passivation layer 30, and the hydrophobic layer 32 is located on the driving electrode layer 312.

The driving electrode layer 312 is connected to the drain 252 of the driving thin film transistor through a via hole penetrating through the second passivation layer 30, the organic insulating layer 28, and the first passivation layer 26. The driving electrode layer 312 is not in contact with the infrared sensitive layer 29. In order not to affect light detection of the infrared sensitive layer 29, the driving electrode layer 312 may be made of a transparent conductive material such as ITO.

The hydrophobic layer 32 may be made of Teflon, which may be formed by spin coating or dip coating combined with an annealing process.

Figure 13:
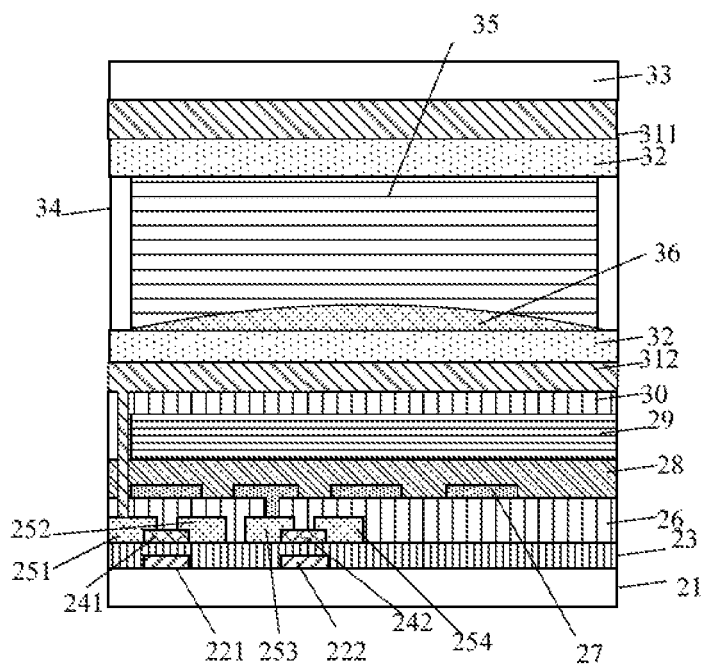
FIG. 13 is a schematic diagram showing an upper substrate and a lower substrate which are aligned and bonded together in an infrared detecting panel according to one embodiment of the present disclosure.

Step 6 includes, as shown in FIG. 13, aligning and assembling the upper substrate 33 and the lower substrate 21, wherein the driving electrode layer 311 and the hydrophobic layer 32 are formed on the upper substrate 33.

In one embodiment, step 6 includes providing an upper substrate 33, wherein a driving electrode layer 311 and a hydrophobic layer 32 are formed on the upper substrate 33. The driving electrode layer 311 is located at a side of the upper substrate 33 facing the lower substrate 21. The hydrophobic layer 32 is located on the driving electrode layer 311. The substrate 33 may be a transparent insulating material such as glass. The driving electrode layer 311 may be made of a transparent conductive material such as ITO in order not to affect light detection of the infrared sensitive layer 29. The hydrophobic layer 32 may be made of Teflon, which may be formed by spin coating or dip coating combined with an annealing process.

The upper substrate 33 and the lower substrate 21 are aligned and assembled together by using a frame sealant 34. The frame sealant does not completely seal the inner space between the upper substrate 33 and the lower substrate 21, and a reserved channel is maintained for injecting the liquid. An insulating dielectric oil 35 having a low refractive index and a droplet 36 having a high refractive index are injected into the space between the upper substrate 33 and the lower substrate 21 through the reserved channel 21. The droplet 36 having a high refractive index may be an ionic liquid.

The driving electrode layer 311 on the upper substrate is the first electrode, and the driving electrode layer 312 on the lower substrate is the second electrode.

The above steps can obtain the infrared detection panel according to one embodiment of the present disclosure. As shown in FIG. 5, the infrared detection panel includes: a lower substrate 21; a driving thin film transistor A and a readout thin film transistor B on the lower substrate 21; a first planarization layer 26 covering the driving thin film transistor A and the readout thin film transistor B; an interdigital electrode 27 on the first passivation layer 26; an organic insulating layer 28 covering the interdigital electrode 27; an infrared sensitive layer 29 on the organic insulating layer 28; a second passivation layer 30 covering the infrared sensitive layer 29; a driving electrode layer 312 on the second passivation layer 30; a hydrophobic layer 32 on the driving electrode layer 312; an upper substrate 33 aligned and assembled with the lower substrate 21; a driving electrode layer 311 and a hydrophobic layer 32 on the upper substrate 33, wherein the driving electrode layer 311 is located at a side of the upper substrate 33 facing the lower substrate 21, and the hydrophobic layer 32 is located on the driving electrode layer 311; a frame sealant that bonds the upper substrate 33 and the lower substrate 21; an insulating dielectric oil 35 having a low refractive index and a droplet 36 having a high refractive index between the hydrophobic layers 32.

The droplet 36 may serve as a microlens. By applying the electric signal to the driving electrode layer 312 from the thin film transistor A, the droplet 36 having a high refractive index can be controlled to move onto the infrared sensitive layer 29 to form a microlens. Moreover, applying an electric signal to the driving electrode layer 312 from the thin film transistor A can control the curvature of the curved interface between the insulating dielectric oil 35 and the liquid droplet 36.

Figure 14:
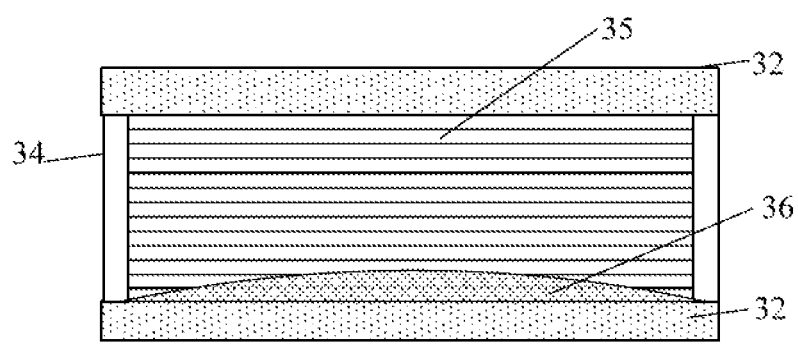
FIG. 14 and FIG. 15 are schematic diagrams showing the adjustment of the focal length of the microlens in an optical detection panel according to some embodiments of the present disclosure.
Figure 15:
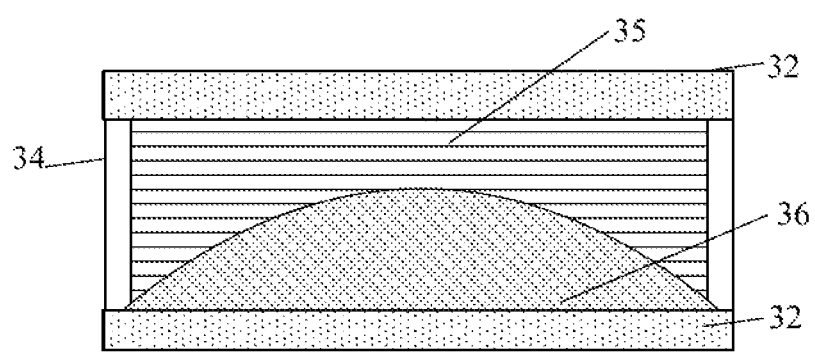

FIG. 14 shows the curved interface between the insulating dielectric oil 35 and the droplet 36 without an electrical signal applied to the driving electrode layer. FIG. 15 shows the curved interface between the insulating dielectric oil 35 and the liquid droplet 36 with an electrical signal applied to the driving electrode layer. As the applied voltage increases, the curvature of the curved interface increases, which corresponds to a shorter focal length of the microlens. Therefore, the focal length of the microlens is the largest when no electrical signal is applied. In one embodiment, the focal length of the microlens is adjustable, and the focal length of the microlens can be adjusted according to the detection wavelength, such that the microlens can precisely match with the detection wavelength, thereby improving the efficiency of infrared light detection.

In some embodiments of the present disclosure, digital microfluidic technology may be introduced into the optical detection panel, and according to the wavelength of the infrared light to be detected, the structure and the path of the electrodes are designed to move the microlens with an appropriate size and a radius of curvature onto the infrared sensitive layer under an external driving signal, thereby completing the fabrication of the microlens. Since the microlens array with a precise position and curvature can be designed according to the needs, and matched with the infrared sensitive layer, the incident efficiency of infrared light of different wavelengths can be greatly improved, and the detection efficiency of the infrared detector can be improved. Furthermore, the driving thin film transistor and the readout thin film transistor can be fabricated in the same patterning process, which does not increase the fabrication cost of the optical detection panel.

Another embodiment of the present disclosure further provides a display apparatus, including the optical detection panel as described above. Thee display apparatus may be any product or component having a display function, such as a television, a display, a digital photo frame, a mobile phone, a tablet computer, etc. The display apparatus may further include a flexible circuit board, a printed circuit board, and a backboard. The display apparatus is capable of displaying the detection results of the optical detection panel.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit, and scope of the invention.

The above are preferred embodiments of the present disclosure, and it should be noted that those skilled in the art can also make several improvements and modification without departing from the principles of the present disclosure. All such similar substitutes and modifications apparent to those skilled in the art are deemed to be within the spirit, scope, and concept of the disclosure as defined by the appended claims.

What is claimed is:

1. An optical detection panel, comprising:
   a first substrate and a second substrate;
   photosensitive component and a driving thin film transistor;
   a first electrode and a second electrode; and
   a plurality of microlenses;
   wherein the first substrate is an upper substrate, the second substrate is a lower substrate, the photosensitive component, the driving thin film transistor, the first electrode, the second electrode, and the plurality of microlenses are disposed between the first substrate and the second substrate;
   the photosensitive component, the driving thin film transistor, and the second electrode are disposed at a side of the second substrate facing the first substrate, the second electrode is connected to the driving thin film transistor, the first electrode is disposed at a side of the first substrate facing the second substrate, the first substrate and the second substrate is mounted together to form a gap between the first electrode and the second electrode, and the plurality of microlenses is disposed in the gap; and
   the first substrate and the second substrate are encapsulated using a frame sealant to form the gap, and each of the plurality of microlenses locates at a fixed position in the gap.

2. The optical detection panel of claim 1, further comprising:
   a readout thin film transistor at the side of the second substrate facing the first substrate,
   wherein the photosensitive component is configured to generate electrical signals when being exposed to the light, and
   the readout thin film transistor is configured to receive the electrical signals generated by the photosensitive component.

3. The optical detection panel according to claim 2, further comprising:
   a first hydrophobic layer at a side of the first electrode facing the second electrode; and
   a second hydrophobic layer at a side of the second electrode facing the first electrode,
   wherein each of the plurality of microlenses is formed from a droplet, the droplet is between the first hydrophobic layer and the second hydrophobic layer, and each of the plurality of microlenses is configured to focus light onto the photosensitive component under control of an electric field between the first electrode and the second electrode.

4. The optical detecting panel according to claim 3, wherein the optical detection panel is a detection panel for detecting X-ray, further comprising:
   a scintillator layer at a side of the microlenses opposite from the photosensitive component,
   wherein the scintillator layer is configured to convert the X-ray into visible light, and the photosensitive component is a photodiode.

5. The optical detection panel according to claim 3, wherein the optical detection panel is a detection panel for detecting infrared light, further comprising:
   interdigitated electrodes including a first interdigital electrode and a second interdigital electrode, wherein the interdigitated electrodes are disposed between the readout thin film transistor and the photosensitive component and the first interdigital electrode is connected to the readout thin film transistor.

6. The optical detection panel according to claim 5, wherein the photosensitive component comprises:
   an infrared sensitive layer,
   wherein the infrared sensitive layer is configured to transduce the infrared light into the electrical signals.

7. The optical detection panel according to claim 6, further comprising:
   an organic insulating layer between the first interdigital electrode and the infrared sensitive layer and between the second interdigital electrode and the infrared sensitive layer.

8. The optical detection panel according to claim 3, further comprising
   an insulating dielectric oil having a first refractive index and the droplet having a second refractive index;
   wherein the insulating dielectric oil is disposed between the first hydrophobic layer and the second hydrophobic layer, the second refractive index is greater than the first refractive index, and the insulating dielectric oil and the droplet form a curved interface.

9. The optical detection panel according to claim 8, wherein the droplet comprises an ionic liquid or a polymeric solution.

10. The optical detection panel according to claim 1, wherein a center of the photosensitive component is on an axis of one of the microlenses.

11. A display apparatus comprising the optical detection panel according to claim 1.

* * * * *